United States Patent [19]

Besson et al.

[11] 3,928,073

[45] Dec. 23, 1975

[54] SOLAR CELLS

[75] Inventors: Jean Georges Besson, Meudon; Thuoc Nguyen Duy, Ivry; Wolfgang Palz, Paris, all of France

[73] Assignee: Societe Anonyme de Telecommunications, Paris, France

[22] Filed: Oct. 9, 1974

[21] Appl. No.: 513,461

Related U.S. Application Data

[63] Continuation of Ser. No. 351,034, April 13, 1973, abandoned.

[30] Foreign Application Priority Data

| | | |
|---|---|---|
| Apr. 19, 1972 | France | 72.13738 |
| May 3, 1972 | France | 72.15599 |

[52] U.S. Cl. .......... 136/89

[51] Int. Cl.$^2$ .......... H01L 31/02

[58] Field of Search .......... 136/89

[56] References Cited

UNITED STATES PATENTS

| | | | |
|---|---|---|---|
| 3,322,575 | 5/1967 | Ruehrwein | 136/89 |
| 3,459,944 | 8/1969 | Triebwasser | 250/211 |
| 3,497,698 | 2/1970 | Phelan, Jr. et al. | 136/89 X |
| 3,615,855 | 10/1971 | Smith | 136/89 |
| 3,620,829 | 11/1971 | Beck | 136/89 X |
| 3,664,874 | 5/1972 | Epstein | 136/89 |
| 3,713,893 | 1/1973 | Shirland | 136/89 |

*Primary Examiner*—John H. Mack
*Assistant Examiner*—Aaron Weisstuch

[57] ABSTRACT

A solar cell comprising a p-type doped semiconductor body in whose upper part, exposed to the incident light, there is provided a thin n-type doped zone, the battery being covered in its lower part by a metal electrode and in its upper part by a metal collector grid, wherein the n-type doped layer between the bars of the collector grid is covered by an insulating layer which is transparent to the incident radiation, said insulating layer being itself covered by a conductive layer which constitutes a third electrode and is also transparent to the incident radiation and insulated from the collector grid.

10 Claims, 4 Drawing Figures

SOLAR CELLS

This is a continuation of application Ser. No. 351,034, filed Apr. 13, 1973, now abandoned.

The present invention relates to a solar cell or battery of novel construction which has the advantage over known solar cells or batteries of similar type of a higher energy efficiency, obtained by extending the range of wavelengths of the spectrum emitted by the sun which are effectively utilized by the cell.

A solar cell according to the invention is in the category of known solar cells formed by a p-type doped silicon semi-conductor body in whose upper part, which is exposed to the incident light, there is provided a thin n-type doped zone. Such cells are normally provided with metal electrodes, a first electrode covering the lower surface of the p-type doped semi-conductor body, a second electrode, in the form of a current collecting grid, being formed on the upper surface of the cell where the semi-conductor body is doped n-type. Further, this upper surface is covered with various layers of materials which improve its energy efficiency and/or protect the cell so as to render its quality reliable.

However, it is known that whatever precautions are taken in the course of manufacture of the cell, the n-type doped zone has irregularities or other faults related to the surface conditions. Consequently, the carriers produced in the vicinity of the surface of the cell upon impact of the incident photons, manage to recombine in major part on the ionized surface centres of this zone. Consequently, they do not participate in the conversion of energy that the cell must effect. Further, this effect occurs selectively according to the wavelength of the incident photons and is particularly harmful for the components of the solar radiation the wavelength of which is less than 5,000 A, and this has an adverse effect on the efficiency of such a solar cell.

An object of the present invention is to overcome the harmful action of the surface centres for the shorter wavelengths by a controlled compensation of the electric charges they carry. The surface ions then pass to the neutral atom state without affecting the value of the energy efficiency of the cell in which these shorter wavelengths consequently participate, as opposed to what happens in known solar cells.

For this purpose, a solar cell according to the invention differs from a known solar cell in that, by a new structure, it is organically provided with means for ensuring the controlled compensation of the electric charges carried by the surface recombination centres of the n-doped zone of the semi-conductor body.

A solar cell according to the invention comprises a p-type doped silicon semi-conductor body in whose upper part, exposed to the incident light, there is provided a thin n-type doped zone, the cell being covered in its lower part by a metal electrode and in its upper part by a metal collector grid, wherein the n-type doped layer between the bars of the collector grid is covered with an insulating layer which is transparent to the incident radiation, said insulating layer being itself covered with a conductive layer which is also transparent to the incident radiation and insulated from the collector grid.

In a preferred embodiment, the insulating layer is constituted by silicon oxide formed within the mass by oxidation of the silicon and the conductive layer is constituted by a film of tin oxide $SnO_2$.

In another embodiment, the insulating layer is obtained by evaporation of silicon oxide. Preferably, the cell is provided with an independent source of supply for the third electrode.

In a preferred embodiment, the cell has in a small area of its upper surface, which is in this region bared, of the n-type doped zone, an interfitting arrangement of elementary photovoltaic diodes placed in the p-type doped base zone by successive diffusions of dope zones of alternately one and the other type connected in series by appropriate metallization between zones of opposite type of two successive cells, the third electrode of the solar cell being directly connected to the output of the diode having the highest potential in absolute value with respect to the electrode connected to the p-type doped base zone.

The novel structure afforded by the invention will be better understood with reference to the accompanying drawing in which.

Figure 1:
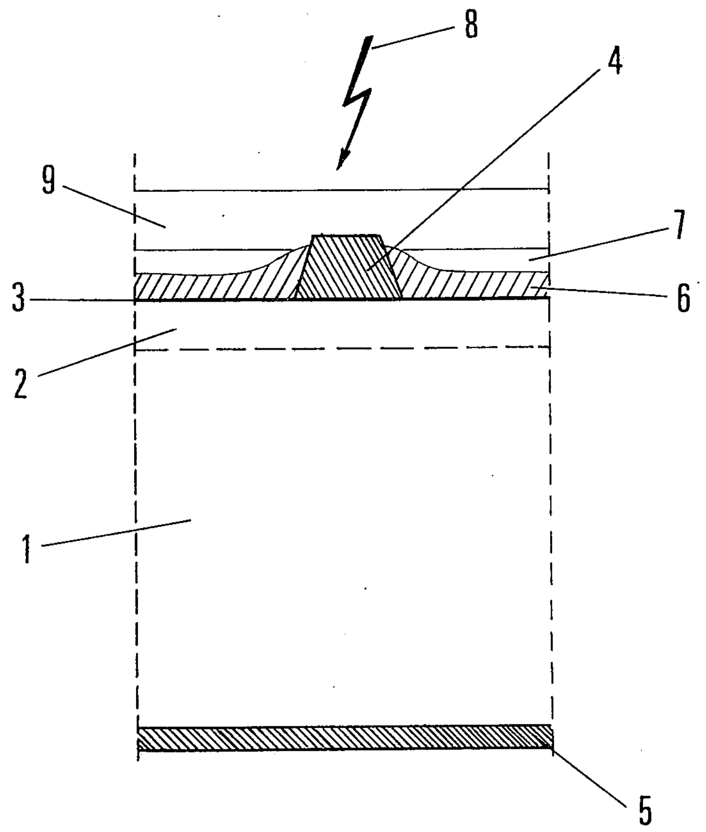
FIG. 1 shows a sectional view of a longitudinal slice or section of the solar cell or battery according to the invention.

With reference first to FIG. 1, the cell or battery comprises a p-type doped zone 1 of the silicon semi-conductor body. This zone has, for example, a height of 300 microns. By known processes this zone is surmounted by a n-type doped zone 2 having a height of the order of 0.5 micron. In its upper part, on a height of the order of 1/100 of a micron, there is a zone 3 comprising recombination centres which are ionized for example negatively. The cell further comprises a collector grid forming an electrode for the zone 2–3, this grid being constituted by bars 4, and a solid electrode 5 for the zone 1. These elements are absolutely analogous to and obtained in the same manner as those in an n-p silicon solar cell or battery known per se.

According to the invention, the surface zone 3 is covered with an insulating layer 6 of silicon oxide and a layer 7 of $SnO_2$, or any other body such as indium oxide $In_2O_3$ which is known to be both an electrical conductor and transparent to incident radiation 8 on the cell. It will be observed that by an appropriate disposition of the layers 6–7, the layer 7 is insulated by the layer 6 from the adjacent element 4 of the collector grid. The assembly may be covered by at least one ordinary and known layer 9 which has antireflection properties and/or may used as a protection.

Owing to the fact that it is thin and bearing in mind also that it is sufficiently conductive, the zone 3 may be likened to a kind of capacitor plate or electrode brought to a negative potential by the assumed ionic charge of the recombination centres which form it. Further, the conductive layer 7 and the insulating layer 6 may constitute, in effect, with the zone 3, a capacitor of which the parts 3 and 7 are the electrodes and the part 6 the dielectric. If the electrode 7 is brought to a negative potential, the surface 6 of the dielectric facing the part 7 is charged negatively and, by influence, the opposite sun face of the dielectric 6 is charged positively. The whole of this sun face and the zone 3 may, if the potential of the electrode 7 is suitably chosen, form as it were a surface assembly having zero resulting charge. Everything operates therefore in respect of the solar cell according to the invention as if the zone 3 no longer intervened in the efficiency of the cell. In practice, no flow is observed between the electrode 7 and the other electrodes 4 and 5 of the solar cell.

As a solar cell is employed grouped with other cells to constitute a battery, the potential to which the electrode 7 is brought may be achieved from the total voltage of the battery, constituting a solar generator.

Figure 2:
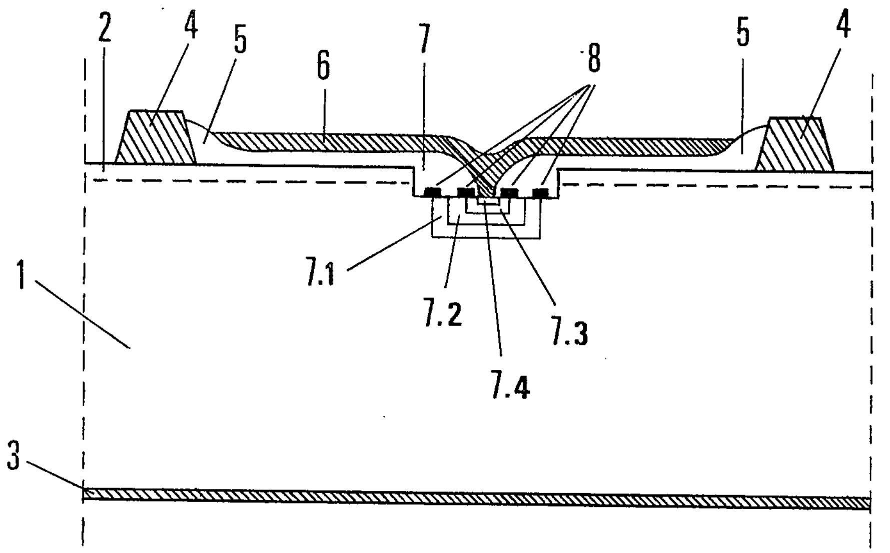
FIG. 2 is a sectional view of a part of a preferred embodiment of the cell according to the invention.

Reference will now be made to FIG. 2 which shows an example of the disposition of a cell according to the invention provided with an independent power source of the third electrode.

In this example, between two bars of the grid of the collector electrode 4, a portion of the zone 2 has been removed of a certain volume 7, here shown in section, so as to once more bare the base zone 1. Four successive diffusions are effected in the zone 1 via the area 7, it being possible to regulate the diffusions so as to obtain the zones 7-1, 7-2, 7-3, 7-4. These zones fit one inside the other and constitute four successive p-n junctions: 7-1 and 7-3 being doped n-type and 7-2 and 7-4 being doped p-type. Such junctions are more easily achieved in the base zone 1 than in the n-type zone 2, since the former is less doped than the latter. The quadruple metallization 8 only leaves as active junctions the n-p junctions achieved between the pairs of zones (7-1 ; 7-3) and (7-3 ; 7-4).

In fact, the zones 7-1 and 7-3 are much less doped than the zone 2 and the volume 7 is very small. Consequently, the elementary photovoltaic cells have a high photovoltaic effect and consequently the relative potential of the zone 7-4 with respect to the electrode 3 of the base zone 1 is higher by 0.8 to 1 volt than that of the electrode 3.

This zone 7-4 is electrically connected to the third electrode 6 of the solar battery, the insulating layer 5 covering in particular the photovoltaic cell (7-1 ; 7-2).

In practice, this disposition shown in FIG. 2 being given by way of example, a higher potential should be available at the third electrode 6 of the solar cell.

Figure 3:
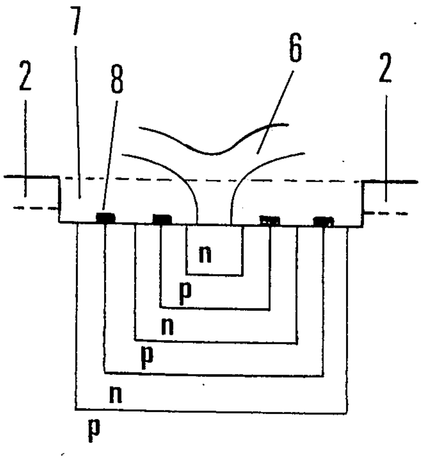
FIGS. 3 and 4 are views, to a larger scale, of a part of the cell shown in FIG. 2 in respect of two modifications thereof.
Figure 4:
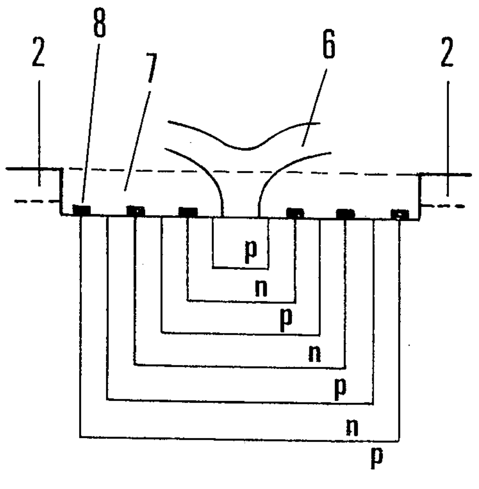

It is possible, as shown in FIGS. 3 and 4, to form in the volume 7 a plurality of interfitting elementary photovoltaic cells by appropriate metallizations 8 there is obtained:

in FIG. 3, the arrangement in series of three p-n cells which give the electrode 6 a polarization, with respect to the electrode 3, which lower by three times 0.5 volt.;

in FIG. 4, the connection in series of three n-p cells which give the electrode 6 a polarization, with respect to the electrode 3, which is higher by three times 0.5 volt.

The solar cell according to the invention is of utility in any application of known solar cells. Its use affords an improved energy efficiency. By providing the cell with independent means for supplying the third electrode, it is possible to constitute batteries forming a solar generator of which the wiring outside the cells is as simple and reliable as that of known generators but which has a still higher energy efficiency.

What we claim is:

1. A solar cell comprising a p-type doped semi-conductor body in whose upper part, exposed to the incident light, there is provided a thin n-type doped zone in the form of a continuous layer, the cell being covered in its lower part by a continuous metal electrode and in its upper part by a metal collector grid constituted of metal bars, wherein the n-type doped layer between the bars of the collector grid is covered by an insulating layer which is transparent to the incident radiation, said insulating layer being itself covered by a conductive layer which is also transparent to the incident radiation and insulated from the collector grid, said conductive layer being maintained at a fixed potential.

2. A solar cell according to claim 1, wherein the cell is provided with an independent power source.

3. A solar cell according to claim 2, wherein the independent power source is constituted of an interfitting arrangement of elementary photovoltaic diodes.

4. A solar cell according to claim 3, wherein the elementary photovoltaic diodes are disposed within the p-type doped zone in a small area of its upper surface from which the n-type doped zone has been removed in this region, by successive diffusions of doped zones of alternately one or the other type connected in series by appropriate metallization between zones of opposite types of two successive cells, the third electrode of the solar cell being directly connected to the output of the diode of highest potential in absolute value with respect to the electrode connected to the p-type doped base zone.

5. A solar cell according to claim 1, wherein the semi-conductor body is of silicon.

6. A solar cell according to claim 1, wherein the insulating layer is constituted by silicon oxide.

7. A solar cell according to claim 1, wherein the conductive layer is constituted by a film of tin oxide, $SnO_2$.

8. A solar cell according to claim 1, wherein the insulating layer is formed within the mass by oxidation of the silicon.

9. A solar cell according to claim 1, wherein the insulating layer is obtained by evaporation of silicon oxide.

10. A plurality of solar cells each of which is constructed according to claim 1 and the solar cells being grouped to form a battery providing a potential equal to the sum of the voltages of the cells and constituting a solar generator.

* * * * *